United States Patent [19]

Huth

[11] Patent Number: 5,021,854

[45] Date of Patent: Jun. 4, 1991

[54] SILICON AVALANCHE PHOTODIODE ARRAY

[75] Inventor: Gerald C. Huth, Hermosa Beach, Calif.

[73] Assignee: Xsirius Photonics, Inc., Fullerton, Calif.

[21] Appl. No.: 500,230

[22] Filed: Mar. 26, 1990

Related U.S. Application Data

[63] Continuation of Ser. No. 128,368, Dec. 3, 1987, abandoned.

[51] Int. Cl.⁵ .................... H01L 27/14; H01L 29/90; H01L 31/12
[52] U.S. Cl. ........................................ 357/30; 357/13; 357/19
[58] Field of Search ............... 357/30 A, 30 D, 30 G, 357/30 H, 30 L, 30 Q, 13, 17, 19

[56] References Cited

U.S. PATENT DOCUMENTS

| | | | |
|---|---|---|---|
| 4,042,454 | 8/1977 | Haas et al. | 357/91 |
| 4,129,878 | 12/1978 | Webb | 357/30 A |
| 4,317,091 | 2/1982 | Dahlberg | 357/13 |
| 4,383,267 | 5/1983 | Webb | 357/30 A |
| 4,403,397 | 9/1983 | Bottka et al. | 357/30 A |
| 4,458,260 | 7/1984 | McIntyre et al. | 357/30 A |
| 4,654,678 | 3/1987 | Lightstone et al. | 357/30 A |

FOREIGN PATENT DOCUMENTS 55-44736 3/1980 Japan .................. 357/30 A

OTHER PUBLICATIONS

Gelezunas et al., "Uniform Large-Area High-Gain Silicon Avalanche Radiation Detectors From Transmutation Doped Silicon", Applied Physics Letters, vol. 30, No. 2, Jan. 15, 1977.

Primary Examiner—Andrew J. James
Assistant Examiner—Ngan Van Ngo
Attorney, Agent, or Firm—Nilsson, Robbins, Dalgarn, Berliner, Carson & Wurst

[57] ABSTRACT

A wafer of neutron transmutation doped silicon having a pn junction between extended opposite surfaces is formed with bevelled edges. A plurality of reverse biased signal contacts is disposed on one surface to provide an integrated array of avalanche photodiodes.

14 Claims, 4 Drawing Sheets

FIG. 9
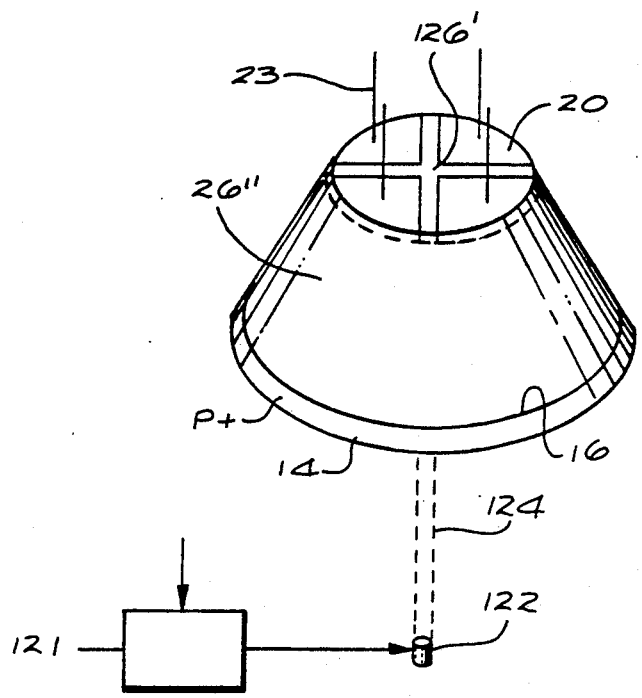
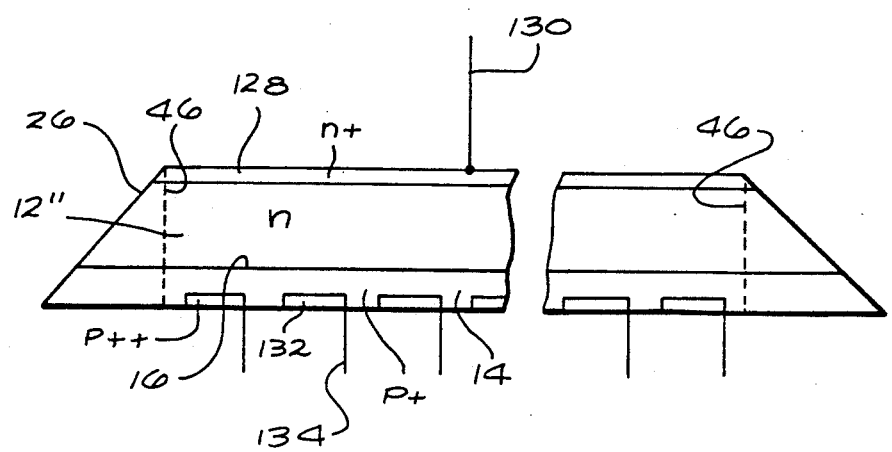
FIG. 10

SILICON AVALANCHE PHOTODIODE ARRAY

This is a continuation application of copending application Ser. No. 128,368, filed Dec. 3, 1987, abandoned.

BACKGROUND OF THE INVENTION

Photodiodes are reverse biased to form a depleted semiconductor region with a high electric field that serves to separate photogenerated electron-hole pairs. A photodiode is operated at a reverse bias voltage that is high enough for electron avalanche multiplication to take place wherein electron-hole pairs are generated by the impact ionization process, giving rise to internal current gains. As pointed out by S. N. Sze in *Physics of Semiconductor Devices*, 2d Ed. John Wylie & Sons, 1981, pp. 766–783, incorporated herein by reference, there are a number of limitations that have been placed on such devices resulting from inherent deficiencies. For example, for high-speed operation, it is desired to keep the depletion region thin, so as to reduce transit time, but, at least for infrared or near infrared absorption, in order to increase quantum efficiency (defined as the number of electron-hole pairs generated per incident photon), the depletion layer must be sufficiently thick to allow a large fraction of the incident light to be absorbed. Sze also points out that an avalanche photodiode requires the avalanche multiplication to be spatially uniform over the entire light-sensitive area of the diode. Of most importance here are "non-uniformities" caused by resistivity fluctuations and variations. Also, microplasmas, that is, small areas in which the breakdown voltage is less than that of the junction as a whole, must be eliminated, or at least minimized by using low dislocation materials, where appropriate, and by designing the active area to be no larger than necessary to accommodate the incident light beam (generally from a few micrometers to 100 micrometers in diameter).

Excessive leakage current due to high field concentration or junction curvature at the surface is eliminated by using a surface-contoured structure. See my prior patent U.S. Pat. No. 3,293,435 entitled "Semiconductor Charged Particle Detector", and Huth, et al U.S. Pat. No. 3,449,177 entitled "Radiation Detector", describing the surface contouring of a radiation detector, as well as Huth, et al U.S. Pat. No. 3,491,272 entitled "Semiconductor Devices With Increased Voltage Breakdown Characteristics" and Huth et al U.S. Pat. No. 3,575,644 entitled "Semiconductor Device With Double Positive Bevel", describing the beneficial effects of a positive bevel on the voltage breakdown characteristics of such devices as rectifiers. The teaching of U.S. Pat. Nos. 3,293,435, 3,449,177, 3,491,272 and 3,575,644 are incorporated herein by reference. In recent years, high power, high voltage thyristors (typically multilayered p-n-p-n devices) have been constructed that not only use bevelled surfaces to maximize the breakdown voltage, but that also use highly uniform n-type silicon obtained by a neutron transmutation doping process. See, in this regard, the discussion in Sze, supra, pp. 190–209.

Large area avalanche devices have been virtually impossible to construct because of what has been referred to as a base resistivity striation problem. As the silicon ingot is grown, dopant segregates in ridges at the growth interface, but not uniformly since the interface is a meniscus, giving rise to a resistivity fluctuation that can be as great as plus or minus 15-20%. The result is a "corrugated" electric field in the junction which prematurely breaks down at its weakest level and limits avalanche gains to about 50 to 100. As a result, avalanche devices have not been able to compete with or supplant image tubes where large area photoresponse is required. Image tubes referred to as "Digicons" make use of semiconductor electron detecting arrays to detect photoelectron images from a photocathode. Since the diode arrays themselves provide no gain, all the gain must be obtained by accelerating the photoelectrons under very high operating voltages, generally 15,000 to 30,000 volts. Such devices have the ability to detect even a single photoelectron but, because of the high voltage requirements, they have significant limitations in dynamic range, useful life, ease of manufacture and mechanical ruggedness, which severely limit their applications. Not only are such devices subject to problems such as arcing from the high acceleration potential, but radiation damage is so severe that spatial resolution degrades with time. This results in a drastic limitation of the number of photons that can be permitted to be incident, limiting such devices to astronomy applications and related uses.

Another type of device that uses an array is a charged coupled device, basically an array of closely spaced metaloxide-semiconductor ("MOS") diodes in which information represented by charge packets is serially transferred across a semiconductor substrate under the application of a sequence of clock voltage pulses. Such devices operate with no internal gain, although "on-chip" low noise FETs provide some amplification of the signal.

SUMMARY OF THE INVENTION

The present invention overcomes the drawbacks referred to above by providing a silicon avalanche photodiode array of extended and incomparable area and having unprecedented avalanche gain values. Specifically, an integrated array of avalanche photodiodes is provided on a single wafer. This is made possible by a synergistic combination of physical features not heretofore combined. A body of neutron transmutation doped ("NTD") silicon, for example in the form of a wafer, having a p-n junction between extended opposite surfaces, has its edge surfaces contoured, more specifically bevelled. A plurality of reverse biased signal contacts is disposed on one surface to provide an integrated array of avalanche photodiodes. The invention is embodied in a number of forms and takes on a number of implementations. In general, however, all embodiments require the uniform resistivity obtained by NTD n-type silicon and surface contouring or bevelling of the edges of the device so that any breakdown due to reverse voltage occurs within the bulk of the semiconductor material instead of at the surface. The photodiode array is defined by signal contacts disposed on one surface, which can take the form of non-injecting n+ or p+ contacts. In particular embodiments the signals are taken out in parallel, whereas in another embodiment the signal contacts are in the form of semiconductor field emission tips and in still other embodiments the device is bonded to a second multiplexing chip or is formed with multiplexing components.

The invention is unique in the formation of an array of avalanche photodiodes. The entrance surface of the device can be treated, for example, to enhance photosensitization in the visible or ultraviolet wavelength region. A pixel plane is thus made adjacent to an avalanche section defining a "gain plane" of about 1,000. The lateral avalanche effect is no longer limited to the millimeter range, but can extend over the entire active region of a silicon wafer from 3 to 7 centimeters in diameter or more. Radiation damage is minimized by the high avalanche electric field. Noninjecting contacts can be defined by n+ regions that are diffused or ion implanted into the NTD n-type semiconductor material, so that a tremendous number of array elements can be formed on the device, essentially limited only by the ability to devise methods to read out signals and by possible sub-micron fluctuations in the NTD-produced phosphorus dopant.

In one form of the invention, a high-density, fine array is provided defined by signal contacts along the relatively flat top surface of the wafer, the edge of the wafer being surface contoured. In another embodiment, a "coarse" array is provided in which individual array elements are isolated by a gridwork of bevelled edges cut through the wafer, for example with a diamond wheel. Such coarse arrays can be particularly useful in the formation of what are known as "quadrature arrays", useful in optical guidance systems, although quadrature arrays can also be constructed of the high-density array elements.

The novel features which are believed to be characteristic of the invention are set forth with particularity in the appended claims. The invention itself, however, both as to its organization and method of operation, may best be understood by reference to the following description taken in connection with the accompanying drawings.

BRIEF DESCRIPTION OF THE DRAWING FIGURES

FIG. 9 is a schematic, perspective view of a quadrature array formed from the high-density arrays of the embodiment of FIG. 1; and FIG. 10 is a schematic cross-sectional view of a silicon avalanche, high-density photodiode array in which the array elements are formed in the p+ region of the device.

DETAILED DESCRIPTION

Figure 1:
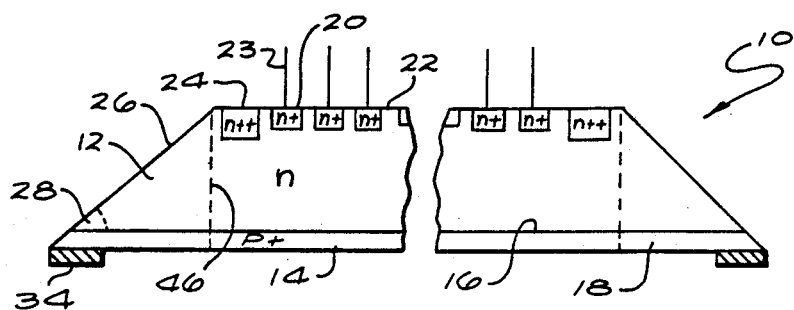
FIG. 1 is a schematic, cross-sectional view of a silicon avalanche high-density photodiode array constructed in accordance with one embodiment of the present invention.

Referring to FIG. 1, an avalanche photodiode array 10 is formed of a wafer 12 of NTD n-type silicon, about 7–10 centimeters in diameter. The process for providing NTD silicon is well-established. See in this regard the "Special Issue on High-Power Semiconductor Devices", i.e., Trans. Electron Devices, ED 23 (1976), in particular the article therein by E. W. Hass and M. S. Schnoller, "Phosphorus Doping of Silicon by Means of Neutron Irradiation", at 803 (1976), incorporated herein by reference. A silicon slice having high resistivity is irradiated with thermal neutrons. The process gives rise to fractional transmutation of silicon into phosphorus and dopes the silicon n-type as follows:

with a half life of 2.6 hours. Since the penetration range of neutrons in silicon is about a meter, doping is very uniform throughout the slice. For example, resistivity variations are about plus or minus 15% for conventionally doped silicon and about plus or minus 0.5% for NTD silicon.

As a result of the neutron transmutation doping process, the silicon wafer 12 has phosphorous impurities very uniformly distributed throughout its bulk. Typically, there are $10^{14}$ to $10^{15}$ phosphorous atoms/cm.$^3$ forming an n-type silicon having a resistivity of about 30–50 ohm-cm. The lower region of the wafer is formed with a p+ layer 14 defining a p-n junction 16 coplanar with the parallel surfaces of the wafer 12. For example, the p+ region can be made by diffusing boron or gallium from a gas into the lower surface of the wafer 12 by techniques which are well known. The p-type impurities are deep-diffused into the surface and a portion is removed from the deeply diffused region in accordance with the teachings of Huth, et al patent 3,449,177. For example, by diffusing boron into the crystal to form a gradient 75 microns deep, and then lapping 20–30 microns, and etching 1–0.5 micron, a flat, polished, major entrance surface 18 is produced in which the p+ region is about 100 microns deep and the p-n junction 16 is about 25 microns thick.

A plurality of non-injecting contacts 20 are formed by diffusion of additional n-type impurity, such as antimony, into the top major surface 22 of the wafer, for example, by use of the well-known planar process or by well known ion implantation processes. The photolithographic techniques used with such processes permit a very large number of signal contacts 20 to be arranged as an array on the top surface 20 of the wafer, each signal contact defining an array element. Each of the array elements 20 constitutes a circular region of n+ type silicon. In similar manner, a guard electrode 24 of n++ type silicon can be formed by diffusion of an impurity such as phosphorus in a ring around the array elements 20. The provision of the guard electrode 24 is of course a well known expedient. It is wider and deeper than any of the individual array elements 20 and can be formed prior to and/or during formation of the guard elements 20.

In the embodiment of FIG. 1, electrical lead wires 23 are connected to each individual array element, for example by thermal compression bonding with a gold silicon alloy, or with pure gold wire. Alternatively, the contacts can themselves form the array elements 20 by using a gold-antimony alloy, for example with about 0.1% antimony, to simultaneously form the heavily doped n+ type region. All of these techniques are well known to the art and do not themselves form a part of the invention.

The result is an array with the capability of massive parallel readout. In this regard, reference can be made to the article "Digicons in Space" in the September, 1980 issue of Electro-Optical Systems Design, pp. 29-37, incorporated herein by reference, where there is described an image tube, referred to as a Digicon using a diode array of 512 elements. The embodiment of FIG. 1, in which 512 array elements are formed through the top surface of the wafer 12, can readily substitute for that diode array, as will be described in more detail below.

The simple nature of the wafer structure used in the embodiment of FIG. 1 and the extremely high uniformity obtained by the NTD process, permits the formation of a diode array that is limited only by photolithographic techniques and the ability to physically arrange for the parallel disposition of individual output contact wires 23.

The photodiode array of FIG. 1, (as with all the embodiments) is reverse biased to provide an avalanche photodiode array. The breakdown voltage of such an avalanche device is determined by a number of factors, including the depth of the p-n junction, and the resistivity of the material. In a typical embodiment, the bulk breakdown voltage is in the range from about 1500 to 2300 volts. Premature breakdown along the edge surfaces of the device is eliminated by using surface contouring, a technique described in Huth, et al U.S. Pat. No. 3,491,272. Such surface contouring is effected in the embodiment of FIG. 1 by bevelling the edges of the wafer 12 using simple cutting and lapping techniques (See, for example, Huth et al U.S. Pat. No. 3,491,272.) so as to form a positive bevelled structure, i.e., one in which the cross-sectional area of the wafer 12 decreases from the heavily doped side of the p-n junction 16 (p+ region 14) to the more lightly doped side (n-type region). In particular, the edge surfaces 26 are bevelled so that the angle 28 formed with the plane of the p-n junction 16 and the major faces 18 and 22 of the wafer 12, is about 10 degrees. A range from about 5 degrees to about 40 degrees is generally useful. The drawing of FIG. 1 is, of course, not to scale.

The positive bevelled contour 26 is illustrative of bevels that may be used. The straight bevel shown is a practical contour and can be readily obtained by simple cutting and lapping techniques. However, more complex contour surfaces related to the shape of the electric field are within the scope of construction of the device of FIG. 1. By providing a contoured surface 26, the device is made bulk limited rather than surface limited. In other words, the peak reverse voltage is limited by the voltage at which avalanche breakdown occurs in the interior of the semiconductor wafer body, rather than being limited by the peak surface electric field.

Figure 2:
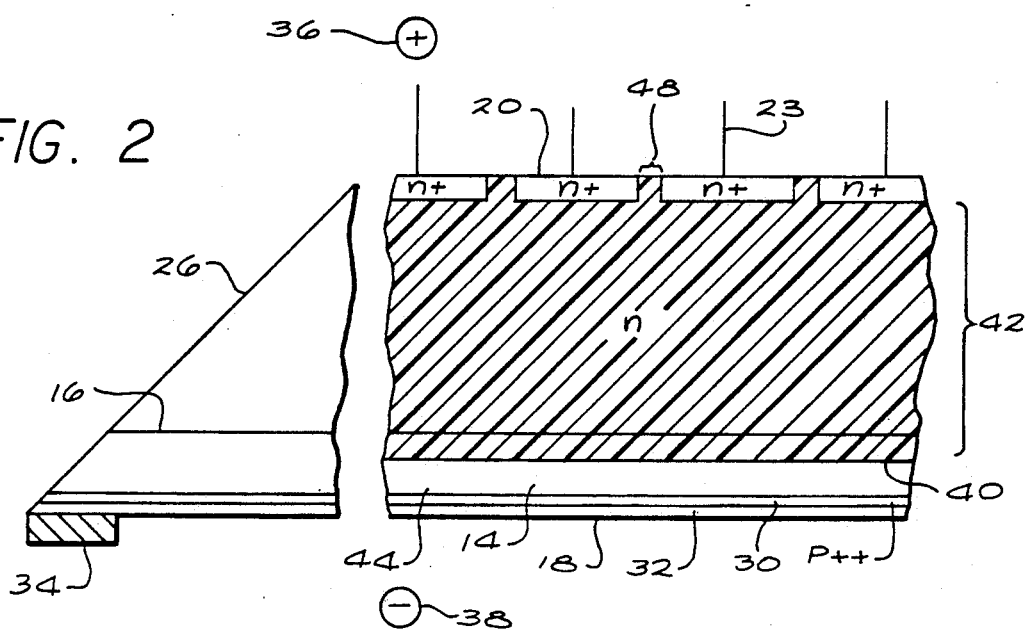
FIG. 2 is a more detailed view of a portion of the embodiment of FIG. 1.

FIG. 2 is a more detailed depiction of portions of the embodiment of FIG. 1. The entrance surface 18 of the wafer includes a thin, (0.1-0.3 micron deep) p++ blue enhanced photosensitizing layer 30 diffused into the p+ layer 14. This minimizes any "dead layer" to increase UV response to the 200-300 nm level. Technology for producing even thinner dead layers on silicon for far UV detection are known. For example a technique known as the "Flash Gate" method comprises applying an extremely thin silicon layer covered with a 10 angstrom thick metallic platinum layer to produce response in the 100 nm region. Such a technique has been applied to charge-coupled 2-dimensional imaging devices for broad wavelength response application. With the avalanche techniques of the present invention, response is possible for even single photons at energies approaching 100 ev, or into the "vacuum UV" region. An antireflective coating 32, for example formed of silicon oxide, is applied to the p++ layer 30.

A front contact ring 34, formed of gold or even conductive epoxy resin, is bonded to the lower surface 18 of the device and acts in conjunction with the leads 23 from the non-injecting contacts 20 and an applied potential of 1500-2300 volts, having positive and negative polarities 36 and 38, respectively, to create a reverse bias voltage high enough for avalanche multiplication to take place. The result is a deep diffused avalanche junction 40 and a depletion region, i.e., an avalanche space charge region, shown by hatching at 42, that spans the p-n junction 16, extending from the avalanche junction 40 to the top surface 22 of the wafer 12. A carrier drift region 44, about 10-25 microns deep, extends from the photosensitizing layer 30 to the avalanche junction 40 and constitutes a pixel plane. The space charge, or avalanche, region 42 therefore constitutes a gain plane immediately adjacent the pixel plane.

As indicated in FIG. 1 by the dashed lines 46, the regions of the wafer 12 below the bevelled edge 26 are inactive, the active portion of the device being confined to those regions in line with the array elements 20. The size of the pixels in the pixel plane is defined by the minimum distance 48 between the array elements, which, in turn, is determined by the resolution obtained by the diffusion or ion implantation step used to form the elements 20 as well as the avalanche spreading factor. As a result, devices can be constructed having pixel dimensions smaller than the 100 μm value which is about the practical limit of charge coupled device technology.

In operation, radiation, indicated by the arrow 50, is incident on the entrance surface 18 of the avalanche device and photons travel through the antireflective coating 32 and photosensitive layer 30 into the drift region 44. Upon entering the avalanche region 42, multiplication takes place as a result of impact ionization. Signals are obtained at the array elements amplified by a gain factor in the range of $8 \times 10^2$ to $10^3$. The device is not only unique in the formation of an array of avalanche photodiodes, but it has gains that are heretofore unprecedented. The avalanche gain extends the radiation damage threshold by up to two orders of magnitude.

Figure 3:
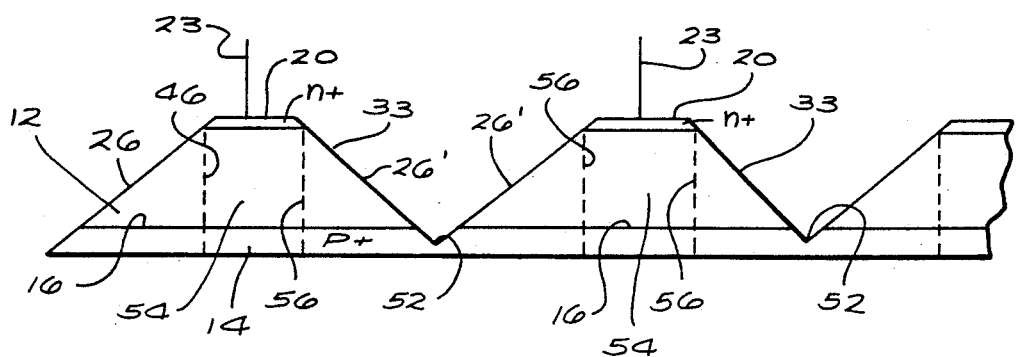
FIG. 3 is a schematic, cross-sectional view of a silicon avalanche, low density photodiode "coarse" array constructed in accordance with another embodiment of the present invention.

Referring to FIG. 3, there is illustrated another embodiment in which a coarse array of avalanche photodiodes is formed. Here also, a wafer 12 of NTD n-type silicon is the starting material in which there is provided a p+ region 14 by techniques identical to that referred to above with respect to the embodiment of FIGS. 1 and 2. Other aspects of the embodiments of FIGS. 1 and 2 are applicable here, for example, the provision of a photosensitizing layer 30 and antireflective coating, but which for simplicity are not illustrated. The major difference between the coarse array of FIG. 3 and the denser array of FIGS. 1 and 2 is the isolation of individual photodiodes 33 by the application of a gridwork of bevelled edges 26' which are similar to the outer edge bevel 26 and in which the angle formed with p-n junction 16 is also the same. In particular, array elements 20 along with associated leads 23 are formed in the manner referred to with respect to FIG. 1, but they are less closely packed. The wafer is cut through in a gridded pattern by means of a diamond wheel, or other cutting device, to form the positive bevels 26'. The bevelling of the wafer 12 is conducted so as to just cut through the p-n junction 16, thereby isolating each of the photodiodes 33 defined by the contacts 20. A plurality of junctures 52 are formed criss-crossing the wafer, isolating the individual diodes 33. With each photodiode 33, there is an active region 54 directly beneath the contact 20, delineated in the drawing of FIG. 3 by the dashed lines 46 adjacent the outer edge and internally by the dashed lines 56. Details of the entrance surface 18 of the coarse array device of FIG. 3 are the same as depicted in FIG. 2.

The coarse array avalanche device of FIG. 3 can be used in many of the applications for which the denser array device is suitable, but has particular utilization in devices which are known as quadrature arrays, which will be referred to hereinafter with respect to the discussion of the embodiment depicted in FIG. 8.

Figure 4:
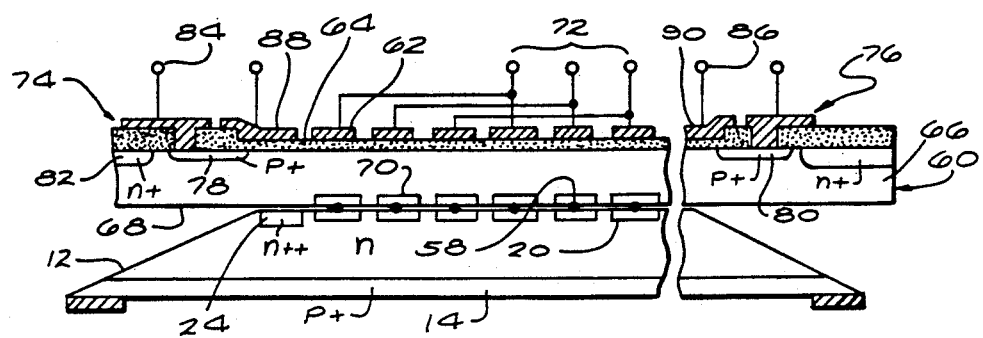
FIG. 4 is a schematic, cross-sectional view of the array of FIG. 1, bump bonded to a multiplexing chip.

Referring to FIG. 4, there is illustrated schematically a particular application of the silicon avalanche photodiode array of FIGS. 1 and 2, but it will be appreciated that it can readily be adapted to the coarse array of FIG. 3. In particular, there is depicted in FIG. 4 the array wafer 12 of FIGS. 1 and 2 with its associated p+ layer 14, contacts 20 and guard electrode 24. In place of lead wires such as shown at 23 in FIG. 1, a dot 58 of indium is placed on each of the n+ contact regions and the device is "bump bonded" to the lower surface of a multiplexer chip 60. Such a chip can take the form of a charge-coupled device ("CCD") in which an array of metal contacts 62 are arranged on a layer of silicon dioxide 64 thermally grown on a wafer of n-type silicon 66. The metal 62-oxide-64-semiconductor 66 sandwich forms the well known MOS diode. The bottom surface 68 of the diode array structure is formed with a plurality of non-injecting contact n+ regions 70 which, like the non-injecting contact array elements 20, are arranged to contact the dots 58 of indium. Indium bump bonding is a standard, well known technique and does not itself form a part of the invention. The composite structure is provided with three-phase output contacts 72 and with input and output diode structures 74 and 76, respectively, defined by direct contact through diffused p+ regions 78 and 80, respectively, and an n+ guard ring 82 is also provided, all in accordance with well known CCD technology.

The structure and operation of the CCD multiplexing chip 60 is essentially the same as for any CCD. Note, however, that the usual p and n types are reversed so as to electrically accommodate transmission of signals from the avalanche photodiode array wafer 12 through the indium bump bonds to the body of the CCD. The input and output diodes 74 and 76, respectively, are biased through respective leads 84 and 86 with high negative voltages to prevent inversion of the surface under input and output gates 88 and 90 which are constituted by MOS diodes on opposite sides of the device. By the application of appropriate clock voltages to the 3-phase inputs 72, as well known, charge packets generated by signals from the avalanche photodiode array elements 20 can be serially transferred.

The specific structure of the CCD multiplexing chip and transfer of charge packets are well known and do not themselves form a part of the invention. However, because gain in the avalanche photodiode array is extremely fast (in the sub-nanosecond [less than $10^{-9}$] range), the usual seriatim raster screen refreshment of 1/30 second is not applicable under normal lighting conditions. However, the structure of FIG. 4 is useful for extremely low light level imaging through usual CCD techniques. At higher levels of light, much faster clock pulses are required to flush the charges that are built up by the efficient operation of the unique avalanche photodiode array structure, but with appropriate clocking and movement of recording media, this makes possible extreme slow motion recordings.

Figure 5:
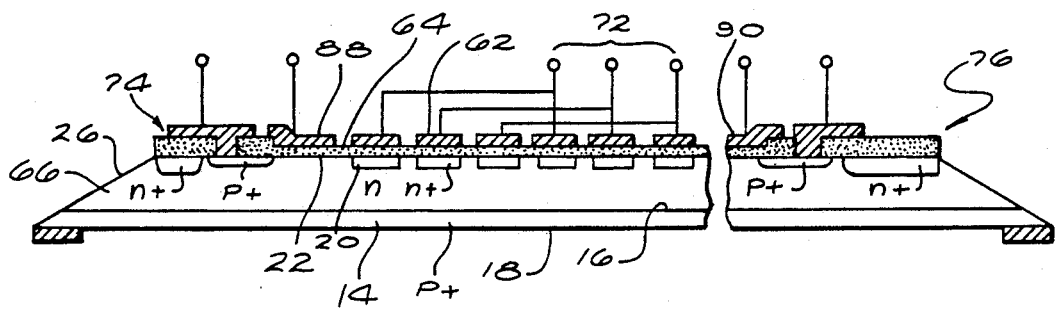
FIG. 5 is a schematic, cross-sectional view of a silicon avalanche photodiode array in which the array elements are MOS diodes.

Referring to FIG. 5, there is depicted a structure that is similar in function to the bump-bonded structure of FIG. 4, but one in which multiplexing is accomplished on the same contoured chip. The components constituting a CCD, i.e., the metal 62-oxide 64-semiconductor 66 (MOS) and associated input and output diode and input and output gates 74, 76, 88, and 90, respectively, along with the 3-phase electrode structure 72, are the same in the embodiment of FIG. 5 as they are in the embodiment of FIG. 4.

The major difference is that the n-type silicon 66 of the CCD is NTD silicon, and is formed with the array, p-n junction and bevelled edge surfaces of the avalanche photodiode array of FIGS. 1 and 2. More particularly, the n-type silicon is the same NTD silicon that constitutes the wafer 12 of the embodiment of FIGS. 1 and 2. A p+ region 14 is diffused into the lower entrance surface 18 to form a p-n junction 16 therein. As with the embodiment of FIGS. 1 and 2, the edge surfaces 26 are bevelled. Before growing the silicon dioxide layer 64, the n+ array elements 20 are somewhat more deeply diffused into the top surface 22 of the body of silicon 66. The embodiment of FIG. 5 has the same advantages and characteristics, and operates in the same manner, as the device of the embodiment of FIG. 4.

Figure 6:
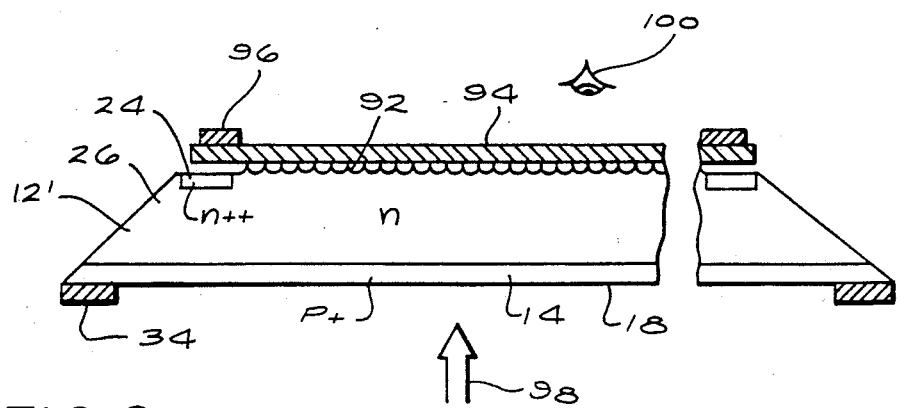
FIG. 6 is a cross-sectional view of a silicon avalanche, high-density photodiode array employing semiconductor field emission field tips, in accordance with another embodiment of the present invention.

Referring to FIG. 6, a silicon avalanche, high density photodiode array wafer 12' is illustrated, which employs etched or otherwise formed semiconductor field emission "tips" in contact with a phosphor plate 94 to provide direct visualization of an amplified radiation image. Below the top surface, the array wafer 12' is formed in accordance with the array wafer 12 of FIGS. 1 and 2, with its associated p+ layer 14, guard electrode 24 and bevelled edge 26. In place of the contacts 20 and lead wires 23 of FIG. 1, the top surface of the wafer 12 is formed with a plurality of field emitter tips, such as described by Schroder et al in "The Semiconductor Field-Emission Photocathode", IEEE Transactions on Electron Devices, Vol. Ed-21 No. 12, Dec. 1974, pp. 785-798. Alternatively, the field emission tips can be constructed in accordance with C. A. Spindt, in his U.S. Pat. No. 4,141,405 and is also described in the article by Naomi J. Freundlich, "Microtip TV", Popular Science, August, 1987, pp. 60-61 and 89. The tips are in contact with or closely adjacent the phosphor plate 94 which is formed by standard techniques. A potential is applied to metal contact rings 96 and 34 disposed respectively on the phosphor plate 94 and wafer 12' to create a reverse bias for avalanche multiplication. A light image, indicated by the arrow 98, applied to the entrance surface 18 of the avalanche wafer 12' is amplified and transmitted by the field emission tips 92 to the phosphor plate 94. As a result of phosphorescence occurring at the phosphor plate, the amplified image can be viewed by the eye as indicated schematically at 100.

Figure 7:
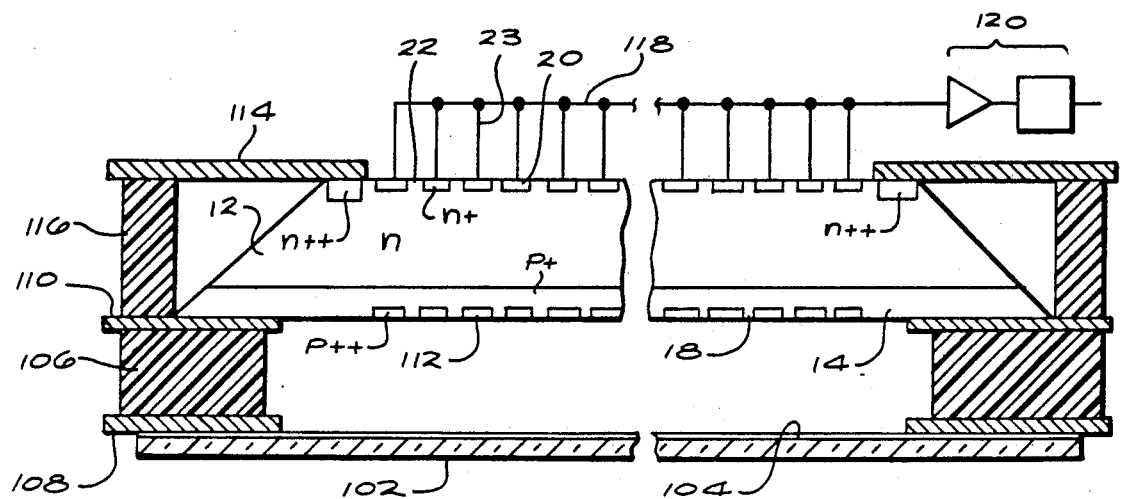
FIG. 7 is a schematic cross-sectional view of the array of FIG. 1 connected to act in conjunction with a photomultiplier to form a hybrid, part solid state, Digicon, in accordance with another embodiment of this invention.

FIG. 7 illustrates a device utilizing "hybrid" photomultiplication, in essence, a "Digicon" type image tube in which an avalanche photodiode array replaces the no-gain diode array normally used in such devices. Photodetectors of the Digicon type are fabricated using a traditional vacuum/photocathode assembly. High voltage accelerates generated photoelectrons into an array of silicon diodes. Essentially the device is an imaging photomultiplier tube using an ordinary photocathode as a photon/electron converter on one end and a silicon semiconductor photodiode array on the other end. The device provides for single photoelectron counting capability by applying a voltage of 15-30 kilovolts between the photocathode and the silicon diode array, achieving an electron gain of from $5 \times 10^3$ to $10^4$. Angular spatial resolution is a function of a number of factors such as the number and spacing of the silicon diodes (currently the smallest spacing being on 100 micrometer centers) and the high voltage applied to accelerate the photoelectrons into the silicon array. Dynamic range is a serious limitation in these devices with limits set by the noise background (i.e., counts detected by the diode with no optical signal incident) of about 10 counts per second to a maximum count rate of about $10^4$ counts per second. The upper limit is set by the slow collection time of the diodes used thus far, which are ordinary, non-amplifying silicon photodiodes, and the necessarily slow, charge sensitive electronic preamplification that must therefore be used. Radiation damage in the silicon diode array caused by the interaction of the electrons accelerated by these very high voltages is a serious problem and one which limits the life of the detector, currently to only about $10^{12}$ counts per diode image element.

For example, with a Digicon, in order to generate a measurable signal from an initial single photoelectron (from an optical photon interaction), the detector employs an acceleration voltage of 20-30 kilovolts within its enclosed vacuum. The signal generated is calculated in electron-hole pairs by dividing the voltage by approximately 3 ev/electron-hole pair. Therefore, under an acceleration of say 20 kilovolts, about 5500 electron-hole pairs are generated. Such a signal level is at just about the noise limit of a room temperature operated diode with associated charge sensitive preamplification electronics. Voltages greater than 20 kilovolts are often employed to get useful signal levels from the detector. While the Digicon is an extra-ordinary device, with a tremendous optical detection capability, elaborate components are needed to provide magnetic focusing and deflection and it has all the limitations that have been previously referred to herein, attributable to the requirement that very high voltage levels be used.

Because of the multiplication obtained by the avalanche photodiode array of the present invention, a hybrid, Digicon-type device can be constructed which obtains an equivalent generation of electron-hole pairs but at only a fraction of the voltage, i.e., about 3-5 kilovolts. Alternatively, the hybrid device can maintain the detector voltage at the 20 kilovolt level with the resultant signal level being as high as $5.5 \times 10^6$ electron-hole pairs. Such a large output signal can have many ramifications, among which are a general simplification of associated electronics. Noise in the low level output of non-gain diodes effectively "smears out" resolution between diode elements and is a limiting factor. For example, at the 20-kilovolt range, the magnitude of the scattering distance of electrons in a silicon diode becomes about 25-50 micrometers, which is close to the measured resolving power of the Digicon detector. Since the signal level determines the ultimate spatial resolving power in high density arrays, the spatial resolving power of the device can be raised by this invention to a few micrometers from the current 20-100 micrometer level.

Referring more specifically to FIG. 7, the hybrid, Digicon-type device of this invention includes on the "Digicon side" a flat, optical glass face plate 102, carrying on its top surface a photocathode layer 104, separated, but closely spaced from, the entrance surface 18 of the avalanche photodiode array of FIGS. 1 and 2 by means of a ceramic insulator ring 106. High voltage electrode rings 108 and 110 are disposed respectively between the photocathode surface 104 and insulator ring 106 and between the insulator ring 106 and entrance surface 18 of the avalanche photodiode array wafer 12. The distance obtained between the photocathode surface 104 and the entrance surface 18 of the avalanche wafer 12, for example, about a millimeter is sufficiently small to enable simple proximity focussing,.

The avalanche photodiode array wafer 12 is as described with respect to FIG. 1, except that a plurality of p++ regions 112 may be formed, e.g., by diffusion or ion implantation of boron, into the p+ region 14. The p++ regions 112 serve as "acceptors" for electrons accelerated from the photocathode layer. The p++ regions 112 can be as numerous as the n+ array elements 20 to maintain spatial resolution, but mutual alignment between the p++ regions 112 and array elements 20 is not required.

A third high voltage electrode ring 114 is disposed to contact the top surface 22 of the avalanche photodiode array wafer 12 and is supported on and spaced from the middle high voltage electrode 110 by means of a ceramic insulator ring 116. Leads 23 from the array elements 20 are connected to a bus 118 which, in turn, is connected to pulse detection electronics 120 which includes amplifiers, discriminators, counters, etc., all as known in the Digicon art. The nature of the optical glass 102 and associated photocathode surface 104, method of association, and the photodetection electronics, are well known to the art and do not themselves form a part of the invention.

The composite, hybrid structure is clamped or otherwise secured and, during construction, a vacuum is applied so that there is a vacuum between the photocathode surface 104 and avalanche wafer entrance surface 18.

"Dead layer" considerations at the front surface of the avalanche photodiode array require that the input electron be accelerated so as to have a range in silicon of about 1 micrometer, requiring a voltage range of about 3-5 kilovolts. In this regard, as previously indicated, "Flash Gate" technology has been developed to provide high quantum efficiencies in the visible and extended blue regions of the optical spectrum wherein photoabsorption is of the same depth of a micrometer, or less.

As indicated in FIG. 7, in an exemplary embodiment, a voltage of 5 KV is applied across the lower high voltage electrode rings 108 and 110 to accelerate electrons from the photocathode surface 104, providing as a result of that acceleration, about $1.4 \times 10^3$ electron-hole pairs. A voltage of 6.5 KV is applied to the top high voltage electrode 114 with respect to the bottommost electrode 108, resulting in an internal avalanche gain of about $10^3$, for a total gain of approximately $1.4 \times 10^6$.

Figure 8:
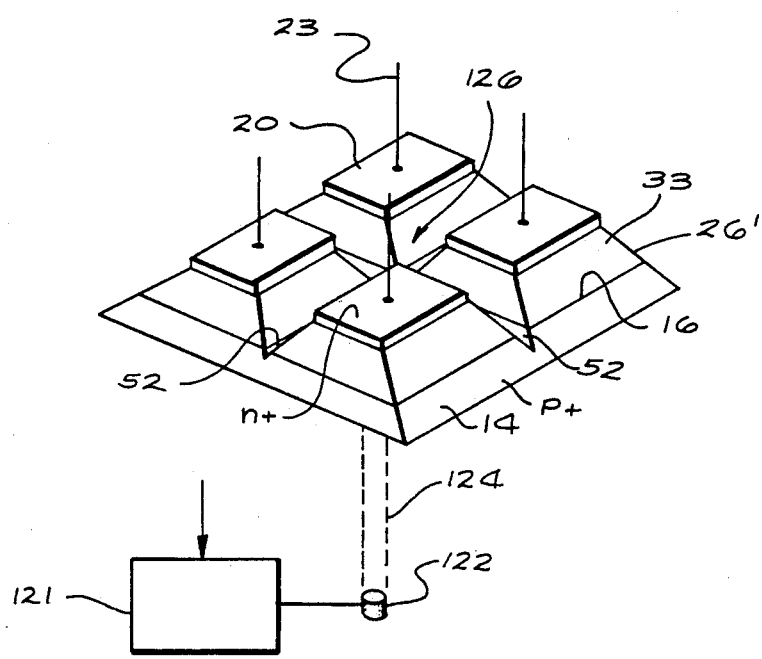
FIG. 8 is a schematic, perspective view of a quadrature array formed from four of the coarse arrays of the embodiment of FIG. 3.

Referring to FIG. 8, a particular application of the coarse array structure of FIG. 3 is illustrated, obtained by separating four of the isolated coarse array diodes 33 integrally disposed in quadrature array. The photodiodes 33 are formed with bevelled edges 26' and share a common p+ layer 14, but as indicated in FIG. 2, the p-n junction 16 of each diode 33 is separated from that of each of the other diodes by the junctures 52. The electrical leads 23 from each n+ region 20 are connected to a feedback mechanism 121 which in turn is connected to an imaging system including a lens or semiconductor laser 122. The feedback mechanism and method of connection, and the imaging system and lens or laser 122 are all in accordance with techniques that are well known to the art and do not themselves form a part of the invention.

In operation, a light beam 124 from the lens or suitably disposed laser 122, is centered at the juncture 126 common to the four photodiodes 33. As the beam moves off center, it generates a signal to the leads 23 which is fed back to the controlling mechanism for an adjustment in the appropriate direction to recenter the beam 124.

Referring to FIG. 9, a quadrature array is shown which functions in the same manner as the device of FIG. 8, but in which the array elements 20 are obtained from the avalanche photodiode array wafer 12 of FIGS. 1 and 2. Four such elements 20 disposed in quadrature array are isolated and cut from the wafer 12 so as to be provided with bevelled surfaces 26". Here, too, the device includes a p+ region 14, but a common p-n junction 16. A light beam 124 from a lens or semiconductor laser 122 is applied to the junction 126' centrally disposed between the four array elements 20. Signals obtained from the leads 23 are applied to the feedback mechanism 121 in the manner described with respect to the coarse quadrature array of FIG. 8.

Referring to FIG. 10, an avalanche photodiode array wafer 12" is shown, which is similar to the avalanche photodiode array wafer 12 of FIG. 1 in the utilization of NTD n-type silicon and in the provision of bevelled surfaces 26 and a p+ region 14 (but without the p++ photosensitive layer 30). However, in place of the n+ contacts 20 of FIG. 1, the n+ region is defined as a single non-injecting contact region 128 extending across the entire top surface of the wafer, including a central lead 130. The photodiode arrays are formed as a result of diffusion or ion implantation of a plurality of p++ contacts 132 into the p+ region 14, below the p-n junction 16, but limited to the active portion of the device, i.e., exclusive of the inactive regions of the wafer 12" below the bevelled edge 26, as indicated by the dashed line 46. Lead wires 134 from each of the p++ contacts 132 serve the same purpose as served the lead wires 23 of the avalanche photodiode device of FIG. 1, but an edge located and associated with integrated circuitry (not shown) between the diodes. The entrance surface of the photodiode array wafer 12" is as in FIG. 1.

It will be appreciated that the foregoing embodiments illustrate various applications of the silicon avalanche photodiode array structure and that other applications and combinations are possible. For example, in place of the CCD multiplexing chip bump bonded to the avalanche photodiode array, a second avalanche photodiode array can be bump bonded to a first avalanche photodiode array to provide increased photomultiplication. Other modifications and implementations can be made.

What is claimed is:

1. An avalanche photodiode array comprising:
   a body of n-type silicon semiconductor material having phosphorus uniformly distributed therein obtained by neutron transmutation doping, whereby the resistivity of said body is about 30–50 ohm-cm, said resistivity throughout at least an active region of said body has a maximum variance of about 0.5%, said body further having a first body surface and a second body surface opposite to said first surface separated by edge surfaces, and a p-n junction between said first and second body surfaces, said second body surface comprising an entrance surface for receiving light image, said edge surfaces being contoured such that cross-sectional area of said body decreases from said first body surface to said second body surface, whereby premature avalanche breakdown is prevented;
   a plurality of signal contacts forming an array disposed on one of said first and second body surfaces; and
   electrical contact means for reverse biasing said signal contacts.

2. The photodiode array of claim 1 in which said signal contacts are non-injecting contacts defined by n+ regions in said n-type silicon.

3. The photodiode array of claim 2 including junctions cut through said silicon body and through said p-n junction, isolating individual photodiodes from each other.

4. The photodiode array of claim 1 including means for multiplexing signals obtained from said signal contacts, electrically associated with said signal contacts.

5. The photodiode array of claim 2 in combination with a semiconductor multiplexing chip formed with a plurality of non-injecting contact regions bump bonded to said signal contacts.

6. The photodiode of claim 4 in which said means for multiplexing signals comprises multiplexing components integrally formed on said first body surface.

7. The photodiode array of claim 1 in which said signal contacts comprise field emission tips and in which said field emission tips are in contact with phosphor plate means for generating a light image corresponding to radiation received at said entrance surface.

8. The photodiode array of claim 1 in combination with:
   photocathode means for receiving radiation and emitting photoelectrons;
   means for obtaining a vacuum between said photocathode means and the entrance surface of said array; and
   means for applying a voltage between said photocathode means and said photodiode array whereby said photoelectrons are accelerated across said vacuum onto said entrance surface.

9. The photodiode array of claim 1 constituted by four integral photodiodes arranged in quadrature array and defining a juncture therebetween.

10. The photodiode array of claim 9 in combination with means for applying a light beam to the juncture of said quadrature array, and means for generating a correcting signal when said light beam moves from said juncture.

11. The photodiode array of claim 3 constituted by four integral but isolated photodiodes arranged in quadrature array and defining a juncture therebetween.

12. The photodiode array of claim 11 in combination with means for applying a light beam to the juncture of said quadrature array, and means for generating a correcting signal when said light beam moves from said juncture.

13. The photodiode array of claim 1 in which said p-n junction is defined by a p+ layer adjacent said second body surface.

14. The photodiode array of claim 1 in which said p-n junction is defined by a p+ region adjacent said second body surface, an n+ region is defined adjacent said first body surface, and said plurality of signal contacts are non-injecting contacts defined by p++ regions in said p+ region.

* * * * *